United States Patent
Poma et al.

[11] Patent Number: 5,404,053
[45] Date of Patent: Apr. 4, 1995

[54] CIRCUIT FOR CONTROLLING THE MAXIMUM CURRENT IN A MOS POWER TRANSISTOR USED FOR DRIVING A LOAD CONNECTED TO EARTH

[75] Inventors: Alberto Poma, Pavia; Vanni Poletto, Casale Monferrato; Marco Morelli, Milan, all of Italy

[73] Assignee: SGS-Thomson Microelectronics, S.r.l., Agrate Brianza, Italy

[21] Appl. No.: 75,056

[22] Filed: Jun. 9, 1993

[30] Foreign Application Priority Data

Jun. 16, 1992 [EP] European Pat. Off. ............ 92830308

[51] Int. Cl.⁶ .................. H03K 17/60; H03K 3/26
[52] U.S. Cl. ............................ 327/108; 327/73; 327/379; 327/390
[58] Field of Search ............... 307/270, 362, 494, 572, 307/578, 359, 571; 330/288, 257; 323/315, 316

[56] References Cited

U.S. PATENT DOCUMENTS

| | | | |
|---|---|---|---|
| 4,514,648 | 4/1985 | Dotson et al. | 307/362 |
| 4,654,545 | 3/1987 | Giordano | 307/362 |
| 5,017,816 | 5/1991 | Wilcox | 307/270 |
| 5,023,474 | 6/1991 | Wilcox | 307/270 |
| 5,055,719 | 10/1991 | Hughes | 307/270 |
| 5,245,526 | 9/1993 | Balakrishnan et al. | 307/362 |

FOREIGN PATENT DOCUMENTS 0397015 11/1990 European Pat. Off. .
3536447 4/1987 Germany .

OTHER PUBLICATIONS

Patent Abstracts of Japan, vol. 13, No. 264, 19 Jun. 1989.

Primary Examiner—Timothy P. Callahan
Assistant Examiner—My-Trang Nu Ton
Attorney, Agent, or Firm—Robert Groover

[57] ABSTRACT

An improved circuit for controlling the maximum current in a MOS power transistor, in which resistor is in series with the drain-source path of the MOS power transistor. The supply terminal of a transconductance operational amplifier is connected to the output of a voltage-raising or charge pump circuit which can output a voltage higher than that of the voltage supply to which the drain of the MOS transistor is connected. The inputs of the amplifier are connected to the resistor and its output is connected to the gate of the MOS transistor so that, in operation, the maximum current flowing through the power transistor is limited to a value proportional to a reference voltage.

26 Claims, 5 Drawing Sheets

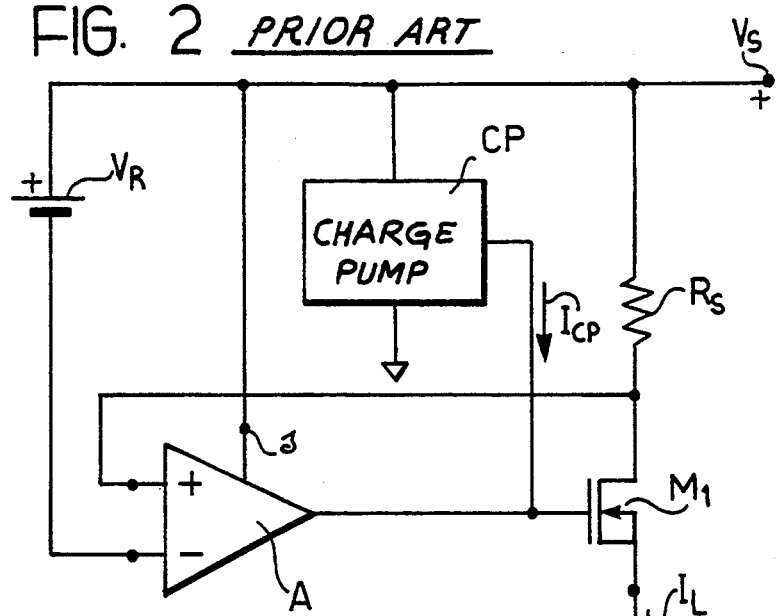
FIG. 2 *PRIOR ART*
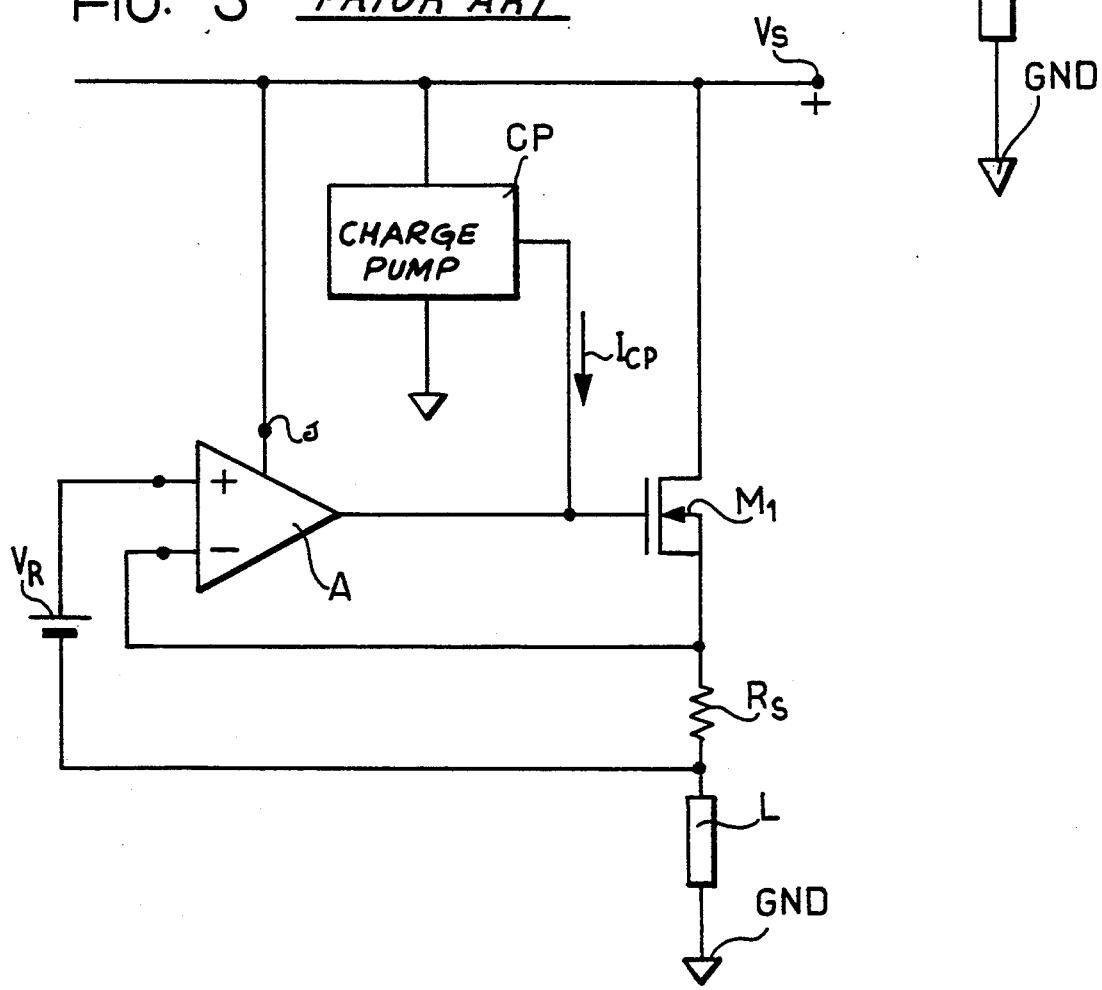
FIG. 3 *PRIOR ART*

CIRCUIT FOR CONTROLLING THE MAXIMUM CURRENT IN A MOS POWER TRANSISTOR USED FOR DRIVING A LOAD CONNECTED TO EARTH

BACKGROUND AND SUMMARY OF THE INVENTION

The present invention relates to a circuit for controlling the maximum current in a MOS power transistor used for driving a load connected to earth.

FIG. 1 of the appended drawings shows a typical circuit of the prior art used to drive a load connected to earth GND. This circuit includes a MOS power transistor M1, for example, an n-channel transistor, with its drain connected to a direct-current supply voltage $V_S$ and its source connected to the load. If the load L is inductive, a free-wheeling diode D1 is arranged in parallel therewith in order, each time the transistor M1 is cut off, to dissipate the energy which the load itself has stored during the previous stage in which M1 was conductive.

The transistor M1 is used as a switch and therefore operates in the triode region. In this region, the transistor M1 operates with a low voltage $V_{DS}$ and behaves essentially as a voltage-controlled resistance, the resistance value of which is lower, the greater the quantity by which the gate-source voltage ($V_{GS}$) exceeds $V_{DS}+V_{TH}$, where $V_{TH}$ is the threshold voltage of the MOS transistor, that is, a voltage such that the transistor is cut off when $V_{GS}$ is less than $V_{TH}$.

In the circuit shown in FIG. 1, it is of fundamental importance that $V_{DS}$ should be small since the lower this voltage is, the greater is the power supplied to the load L.

The gate of the transistor M1 is driven by a charge pump circuit CP of known type. This circuit enables the gate capacitance of the transistor M1 to be charged to a voltage greater than the supply voltage $V_S$, although with currents of low intensity.

If the source of M1 is accidentally short-circuited to earth GND or if the resistance of the load L is very small, the transistor M1 no longer operates in the triode region, but operates in a region in which its drain current depends on $V_{GS}$ and is almost independent of $V_{DS}$.

To limit the power dissipated by the power transistor M1 under these circumstances (in order to prevent damage), it is necessary to limit the drain current by reducing the gate voltage.

The problems connected with the control of the maximum current in a circuit configuration of the type shown in FIG. 1 relate essentially to the frequency stability of the entire system and to the precision of the control.

FIGS. 2 and 3 of the appended drawings show two different known solutions for controlling the maximum current which can flow through the MOS power transistor M1.

The solution shown in FIG. 2 uses an amplifier A which may be a normal operational amplifier or a transconductance operational amplifier. The non-inverting input (+) of this amplifier is connected to the drain of M1 and its inverting input (−) is connected to the negative terminal of a reference-voltage generator $V_R$, the positive terminal of which is connected to the positive terminal of the supply voltage $V_S$. The amplifier A also has a supply terminal s which is connected to $V_S$. The output of the amplifier is connected to the gate of M1.

A resistor $R_S$ is connected between the drain of M1 and the supply voltage $V_S$.

The current supplied to the gate of M1 by the charge pump CP and the current flowing in the load L are indicated $I_{CP}$ and $I_L$, respectively.

FIG. 3 shows another solution according to the prior art. In FIG. 3 the same alphabetical references have again been attributed to parts and elements already described above.

In the solution of FIG. 3, the resistor $R_S$ is between the source of M1 and the load L. The reference-voltage generator $V_R$ is between the load and the non-inverting input (+) of the operational amplifier A. The inverting input of the amplifier is connected to the source of M1.

With both the solutions described with reference to FIGS. 2 and 3, the maximum current which the MOS transistor M1 can supply to the load L is:

$$I_{Lmax}=V_R/R_S$$

The current-regulator circuits of FIGS. 2 and 3 use operational amplifiers and, in order to operate in a stable manner, must be suitably compensated. The gate capacitance of M1, which, in both cases, is connected to the output of the operational amplifier A, involves the introduction of an additional pole in the frequency response which, with the use of an operational amplifier which itself has to be compensated, may make the system unstable, particularly when the MOS transistor used has large physical dimensions and hence a high gate capacitance.

If the amplifier A of the diagrams of FIGS. 2 and 3 is a transconductance amplifier, it must have a very high gain $g_m$ in order to enable precise regulation of the maximum current in the transistor M1 since, in practice, the current $I_{CP}$ coming from the charge pump CP is never known sufficiently accurately.

If the gate capacitance of the MOS transistor M1 is used to compensate the transconductance operational amplifier, the high gain $g_m$ may involve problems of frequency instability, particularly if the MOS transistor used has small dimensions and hence a small gate capacitance.

The object of the present invention is to provide a circuit for controlling the maximum current in a MOS power transistor used for driving a load connected to earth, which enables the current to be controlled more precisely with a low-gain transconductance amplifier which has very good frequency stability characteristics and simple circuitry.

According to the invention, this object is achieved by a control circuit of the type specified above, the main characteristic of which lies in the fact that the charge pump circuit is connected to the supply terminal of the transconductance operational amplifier.

BRIEF DESCRIPTION OF THE DRAWINGS

Further characteristics and advantages of the invention will become clear from the detailed description which follows with reference to the appended drawings, provided purely by way of non-limiting example, in which.

DETAILED DESCRIPTION

Figure 1:
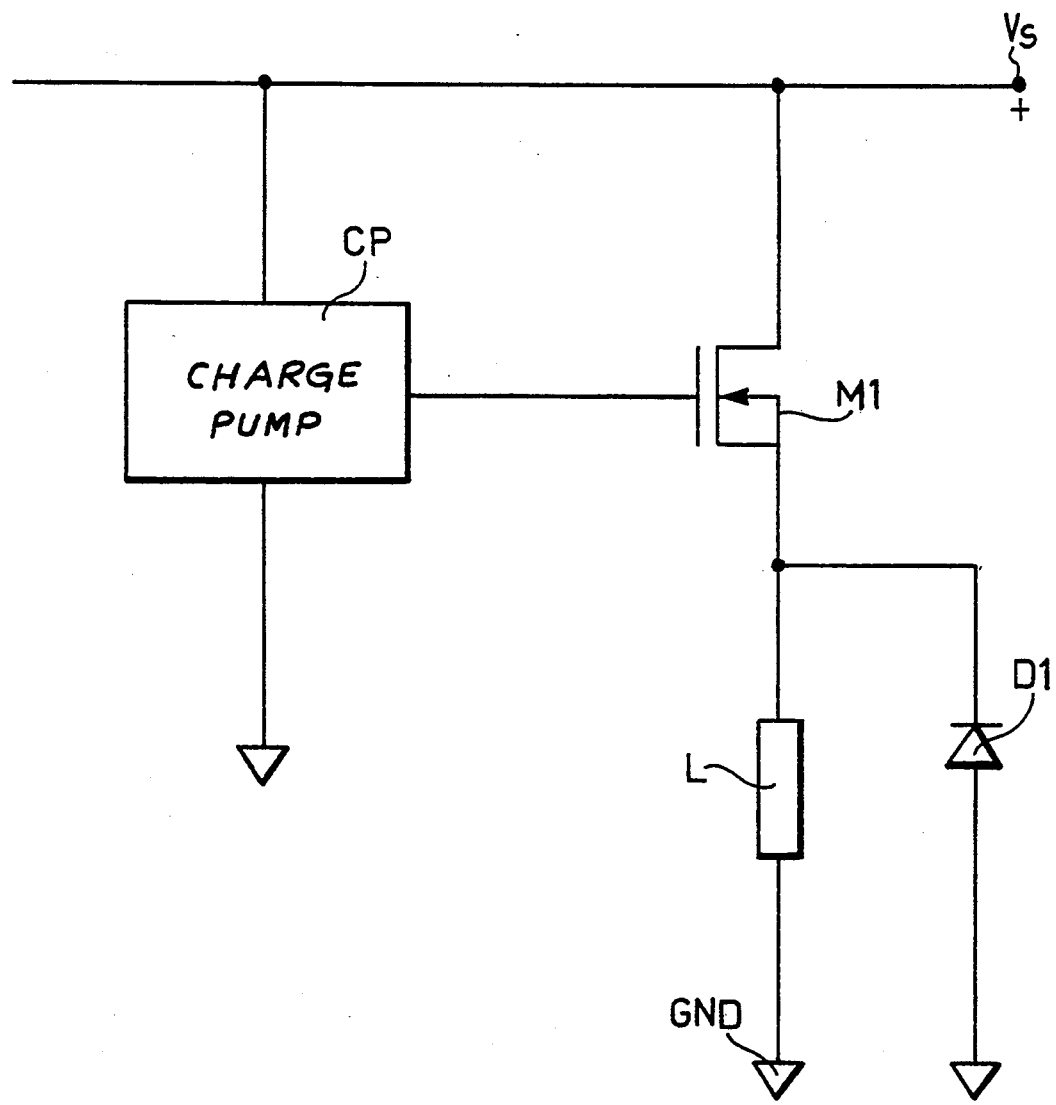
FIG. 1, which has already been described, shows a typical circuit according to the prior art, including a MOS power transistor for driving a load connected to earth, FIGS. 2 and 3, which have already been described, show two solutions according to the prior art for controlling the maximum current which can flow through a MOS power transistor for driving a load connected to earth.
Figure 4:
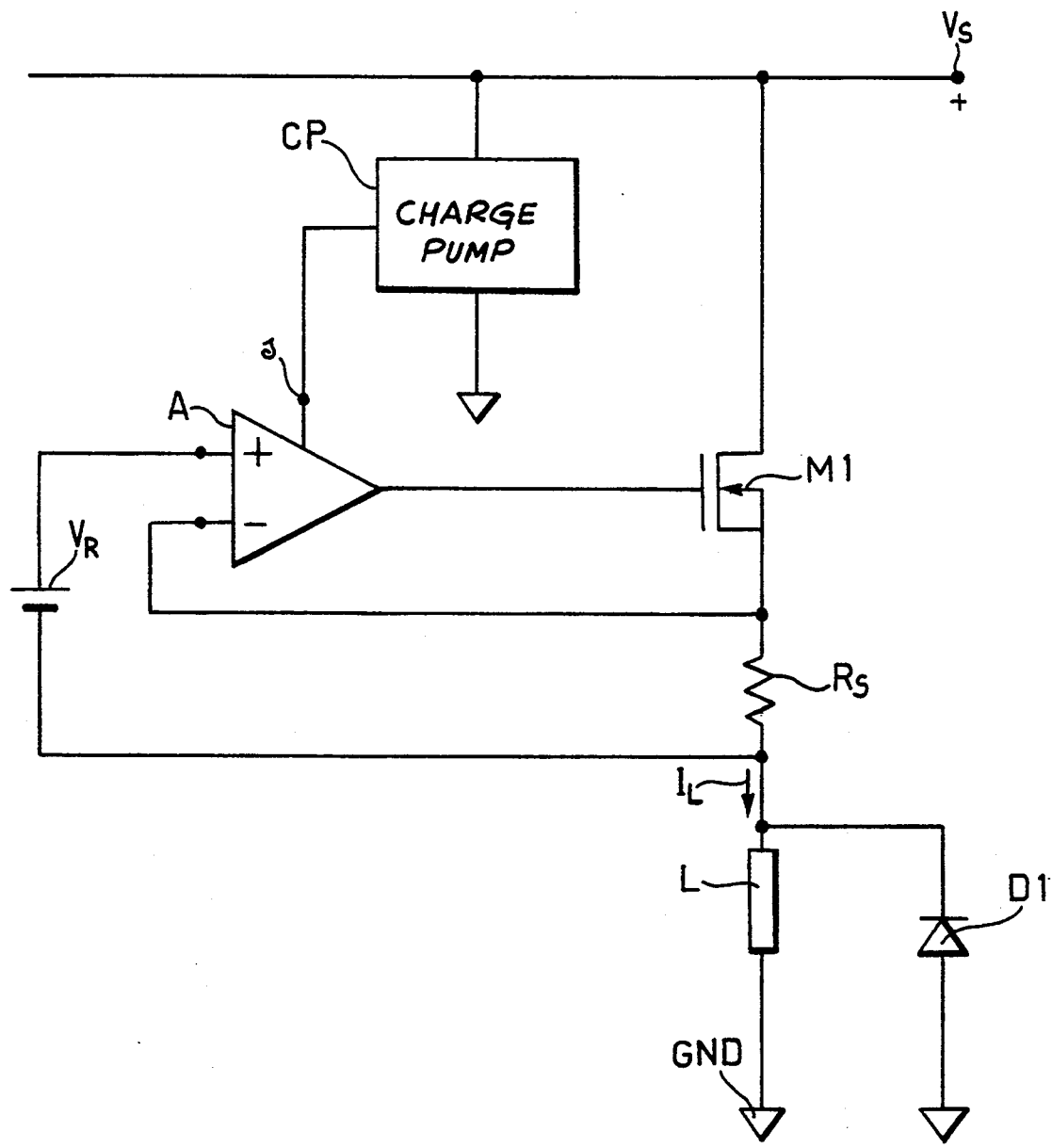
FIG. 4 is a diagram of a control circuit according to the invention.

The control circuit of FIG. 4 differs from that described above with reference to FIG. 3 in that the output of the charge pump CP is connected to the supply terminal s of the operational amplifier A rather than to the gate of the power transistor M1. In particular, this amplifier is a transconductance amplifier with a fairly small gain $g_m$.

In spite of the low value of $g_m$, the current regulation which can be achieved by the circuit of FIG. 4 is quite precise. In fact, in the circuit of FIG. 4, the current is not regulated according to a sum of currents at the gate of M1, as in the case of the circuits of FIGS. 2 and 3, but the output of the amplifier A itself charges or discharges the gate capacitance of M1.

In this layout, the gate capacitance of the MOS power transistor M1 is also used to stabilise the circuit for controlling the current supplied to the load. The low gain $g_m$ of the transconductance amplifier A means that the circuit as a whole is stable event if the dimensions of the transistor M1 are small.

Figure 5:
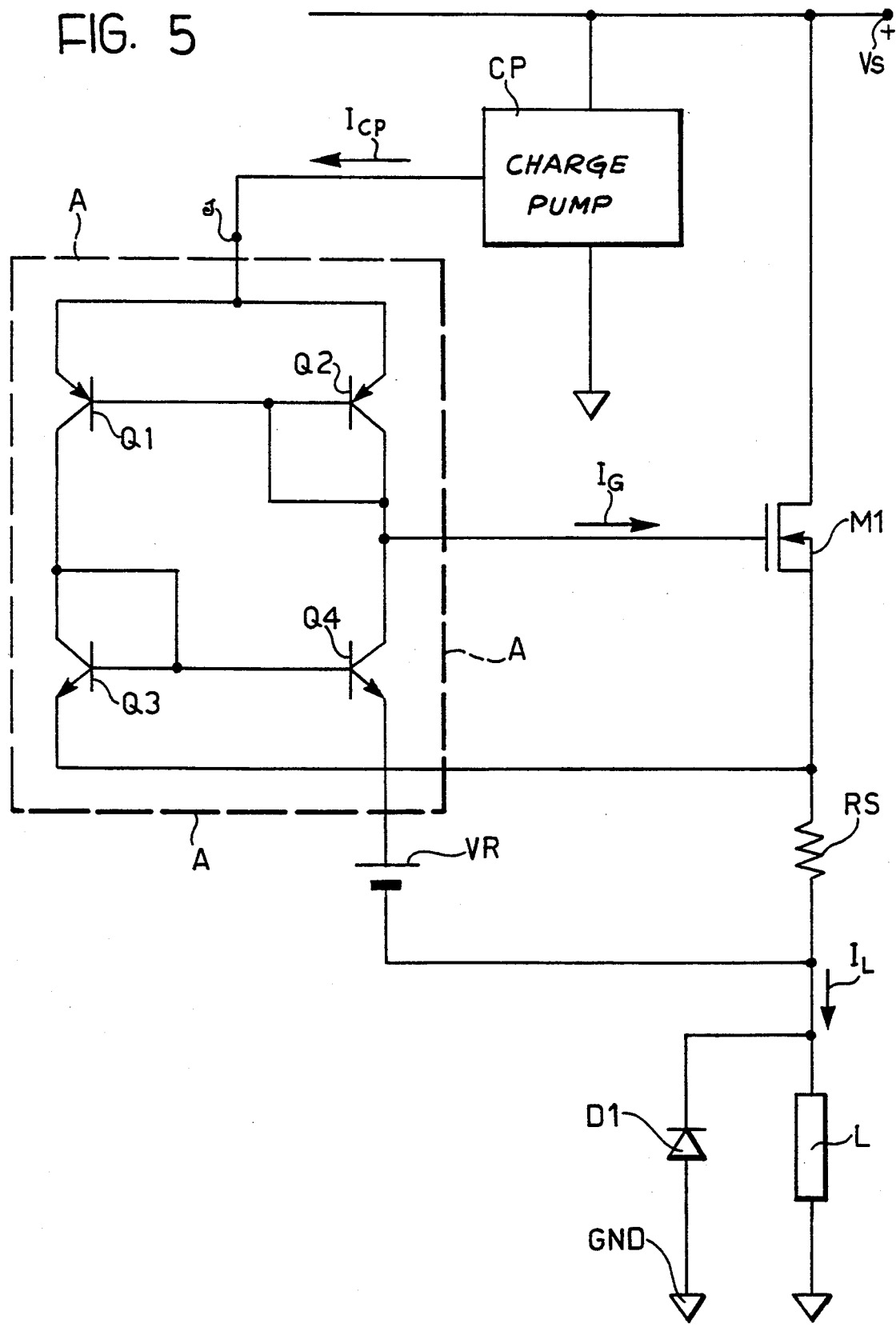
FIGS. 5 and 6 show two possible embodiments of the circuit of FIG. 4, in greater detail.

With reference to FIG. 5, in a first embodiment, the transconductance amplifier A is formed as a current-mirror circuit and includes two branch circuits each including a respective pair of complementary transistors.

In particular, one branch of the current-mirror circuit has two transistors Q1 and Q3 which, in the embodiment illustrated in particular, are bipolar transistors of the pnp type and the npn type, respectively.

The other branch of the current-mirror circuit also includes a pair of transistors Q2 and Q4, of the pnp and npn types, respectively.

The emitters of the transistors Q1 and Q2 are connected to the output of the charge pump CP, their bases are connected to each other, and their collectors are connected to the collectors of Q3 and Q4, respectively. The bases of Q3 and Q4 are connected to each other and their emitters are connected to the source of M1 and to the positive pole of the reference-voltage generator $V_R$, respectively.

The base of each of the transistors Q2 and Q3 is connected to its emitter so that it can operate essentially as a diode.

The transistors Q1–Q4 are formed so that Q1 and Q2 have the same emitter area and Q3 and Q4 have the same emitter area.

The collector of Q4 (Q2) represents the output of the entire transconductance amplifier A and is connected to the gate of M1.

The current supplied to the gate of M1 by the amplifier A is indicated $I_G$.

In operation, the MOS power transistor M1 can supply the load L with a maximum current when $I_G$ is zero, the maximum current depending upon the resistance of the resistor $R_S$ and upon the reference voltage $V_R$:

$$I_{Lmax}=V_R/R_S.$$

In practice, the gain of the transconductance amplifier A of FIG. 5 is the gain $g_m$ of the transistors Q3 and Q4 and is low since the current $I_{CP}$ is very small.

The gate capacitance of M1 is sufficient for the frequency compensation even if the area of the transistor is fairly small.

Figure 6:
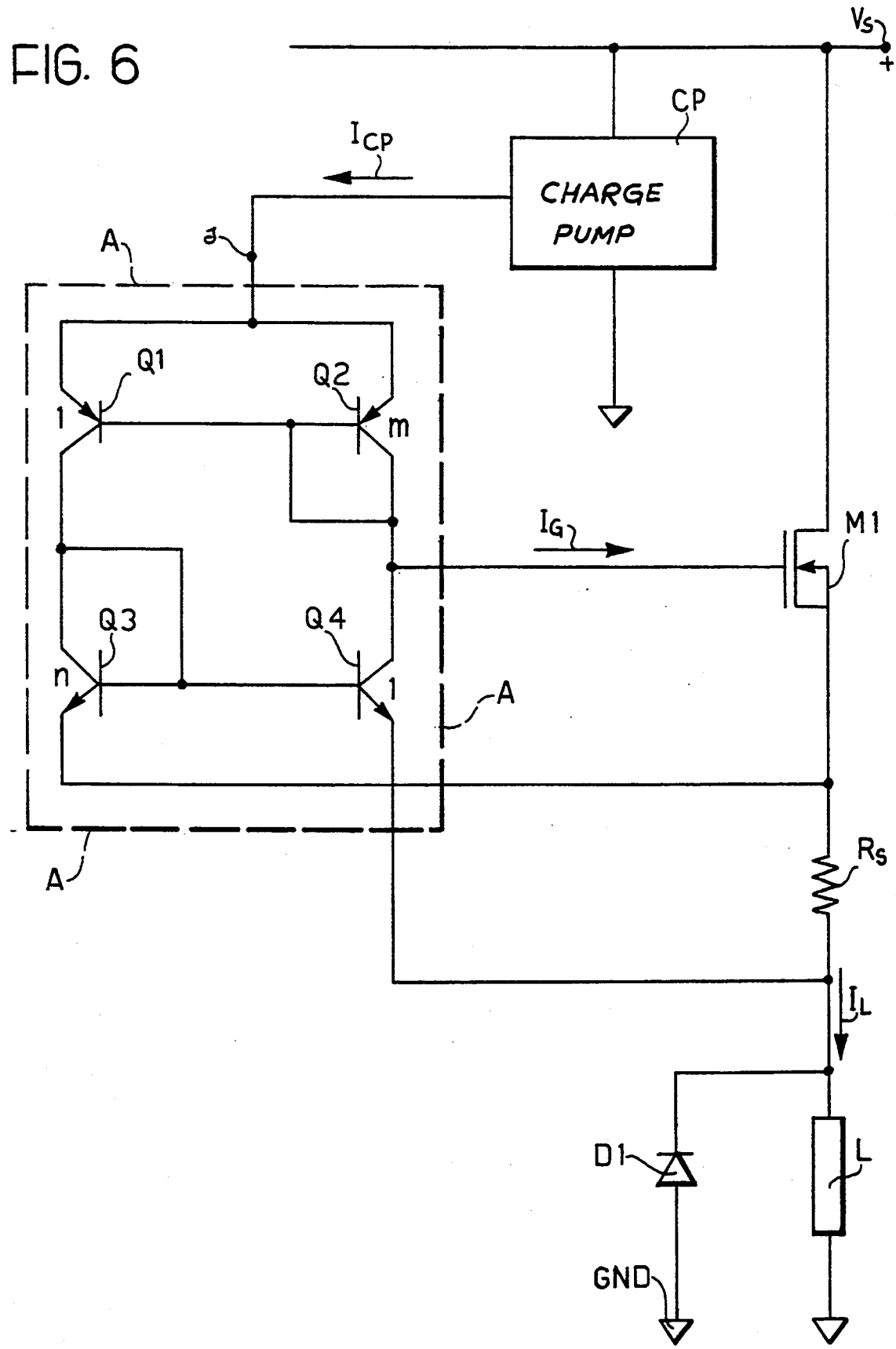

FIG. 6 shows an embodiment of the circuit according to the invention which is similar to that described above with reference to FIG. 5, from which it differs, as can easily be seen, in that the reference-voltage generator VR is absent.

In the embodiment of FIG. 6, the reference voltage is not provided by a generator outside the transconductance amplifier A but is produced within the amplifier because the emitter area of at least one of the transistors Q2 and Q3 differs from that of the respective transistor Q1 or Q4. In general, if the emitter areas of Q2 and Q3 are assumed to be m and n times those of Q1 and Q4, respectively, this produces a reference voltage:

$$V_R=V_T\ln(m/n)$$

in which $V_T$ is the equivalent-temperature voltage and ln indicates the natural logarithm.

The maximum current which the MOS power transistor M1 can supply to the load L is thus expressed by:

$$I_{Lmax}=V_R/R_S=[\ln(m/n)]V_T/R_S.$$

The equation given above indicates how, in the circuit of FIG. 6, limit value of the current which can be supplied to the load can be defined by different emitter areas of one or both of the transistors Q2 and Q3 which operate essentially as diodes.

The solutions described above with reference to FIGS. 5 and 6 provide for the use of bipolar transistors to form the transconductance amplifier. It will be clear to an expert in the art, however, that the amplifier could also be formed with CMOS transistors.

Moreover, the foregoing, which relates to an n-channel MOS power transistor, naturally also applies to a p-channel MOS transistor, with the necessary alteration of details.

The main advantages of the control circuit according to the invention are essentially as follows.

The desired frequency stability can be achieved without the need to add compensating capacitors since the gate capacitance of the MOS power transistor, which may even be small (a MOS power transistor of small dimensions), can be used for this purpose because stability is in any case ensured by the low value of the gain $g_m$ of the transconductance amplifier A.

With a low-gain transconductance amplifier, it is also possible to achieve very precise control of the current supplied to the load since the output of the transconductance amplifier regulates the gate voltage of the transistor M1 directly, unlike the circuits of the prior art in which the gate is charged with a current represented by the sum of the current coming from the charge pump (the value of which cannot, in practice, be determined precisely) and the current coming from the transconductance amplifier. The current-control circuit according to the invention is also quite simple and a small number of components is needed to form the transconductance amplifier. This means that it can easily be used in monolithic integrated circuits.

The use of a transconductance amplifier does not adversely affect the $R_{DSon}$ of the MOS power transistor under non-current-limitation conditions. In operation, the transconductance amplifier absorbs hardly any current from the charge pump CP, enabling the gate voltage of M1 to reach the value it would reach in the absence of the circuit for controlling the maximum current supplied to the load, and the $R_{DSon}$ is therefore the same as it would be if the gate of M1 were supplied directly by the charge pump CP without the amplifier A.

Naturally, the principle of the invention remaining the same, the forms of embodiment and details of construction may be varied widely with respect to those described and illustrated purely by way of non-limiting example, without thereby departing from the scope of the present invention.

We claim:

1. A circuit for controlling the current in a MOS power transistor, having a source and drain, used for driving a load connected to ground, including:
   a direct-current voltage supply to which said drain of the MOS transistor is connected,
   a resistor in series with the drain-source path of the MOS transistor, a charge pump circuit for enabling the gate capacitance of the MOS transistor to be charged to a voltage higher than the voltage of said voltage supply, and
   a transconductance operational amplifier which is connected to be powered from a supply terminals and which has an output connected to the gate of the MOS transistor and differential inputs connected to the resistor in a relationship which limits the current through the power transistor to a maximum value proportional to a reference voltage;
   said charge pump circuit having an output which is connected to supply current to said supply terminal of said transconductance operational amplifier.

2. A control circuit according to claim 1, including a reference voltage generator which is outside said transconductance operational amplifier and is connected between a terminal of the resistor and an input of said transconductance operational amplifier.

3. A control circuit according to claim 2, wherein the transconductance operational amplifier includes a current-mirror circuit comprising:
   a first branch circuit including two transistors of mutually complementary type between the output of the charge pump circuits and a terminal of the resistor, and
   a second branch circuit, also including two respective transistors of complementary type, between the output of the charge pump circuit and the reference voltage generator.

4. A control circuit according to claim 1, wherein the transconductance operational amplifier includes a current-mirror circuit comprising:
   first and second branch circuits which are disposed between the output of the charge pump circuit and respective terminals of the resistor and each of which one includes two complementary transistors of which one has a control terminal thereof connected to a first current-carrying terminal thereof to operate essentially as a diode,
   at least one of the transistors which can operate as diodes having an effective area, at a second current-carrying terminal thereof, larger than those of corresponding terminals of the other transistors of the current-mirror circuit.

5. The circuit of claim 1, wherein said boosted output has a voltage which is more positive than the direct-current supply voltage, and the direct-current supply voltage is positive.

6. The circuit of claim 1, wherein said amplifier is powered exclusively by said charge pump.

7. A circuit for controlling the maximum current in a field-effect power transistor connected to drive a load with a sensing resistor in series therewith, comprising:
   connections for receiving first and second power supply voltages; a charge pump connected to receive said power supply voltages, and therefrom to generate a boosted output at a more extreme voltage than said first power supply voltage; and
   a transconductance operational amplifier connected to receive the voltage across the sensing resistor as a differential input thereto, and connected to receive a supply current from said boosted output, and connected and configured to drive the gate of the power transistor either toward said boosted output, or else toward said second supply voltage, in accordance with said differential input;
   whereby the current through said power transistor is prevented from exceeding a predetermined maximum value.

8. The circuit of claim 7, wherein the first power supply voltage is more positive than the second power supply voltage.

9. The circuit of claim 7, wherein said boosted output has a voltage which is more positive than the first power supply voltage, and the first power supply voltage is more positive than the second power supply voltage.

10. The circuit of claim 7, wherein said amplifier receives said differential input at the emitters of a pair of bipolar transistors which have bases thereof connected together.

11. The circuit of claim 7, wherein said amplifier receives said differential input at the emitters of a first pair of transistors, which are bipolar and have bases thereof connected together, and wherein said charge pump provides said supply current to a second pair of bipolar transistors which are of opposite type to, and connected in series with, said first pair of transistors.

12. The circuit of claim 7, wherein said amplifier receives said differential input at the emitters of a first pair of transistors, which are bipolar and have bases thereof connected together and have unequal emitter areas, and wherein said charge pump provides said supply current to a second pair of bipolar transistors which are of opposite type to, and connected in series with, said first pair of transistors.

13. The circuit of claim 7, wherein said amplifier is powered exclusively by said charge pump.

14. A circuit for controlling the maximum current in a field-effect power transistor connected to drive a load with a sensing resistor in series therewith, comprising:
   connections for receiving first and second power supply voltages; a charge pump connected to receive said power supply voltages, and therefrom to generate a boosted output at a more extreme voltage than said first power supply voltage; and
   a transconductance operational amplifier connected to receive the voltage across the sensing resistor as a differential input thereto, and connected to receive a supply current from said boosted output, and connected to provide an output current therefrom to the gate of the power transistor in accordance with said differential input;
wherein said amplifier includes at least a first transistor pair with unequal current densities, connected to define a voltage offset for said differential input.

15. The circuit of claim 14, wherein said boosted output has a voltage which is more positive than the first power supply voltage, and the first power supply voltage is more positive than the second power supply voltage.

16. The circuit of claim 14, wherein said amplifier receives said differential input at the emitters of a pair of bipolar transistors which have bases thereof connected together.

17. The circuit of claim 14, wherein said amplifier receives said differential input at the emitters of said first pair of transistors, which are bipolar and have bases thereof connected together and have unequal emitter areas, and wherein said charge pump provides said supply current to a second pair of bipolar transistors which are of opposite type to, and connected in series with, said first pair of transistors.

18. The circuit of claim 14, wherein said amplifier is powered exclusively by said charge pump.

19. A circuit for controlling the maximum current in a field-effect power transistor connected to drive a load with a sensing resistor in series therewith, comprising:
 connections for receiving first and second power supply voltages; a charge pump connected to receive said power supply voltages, and therefrom to generate a boosted output at a more extreme voltage than said first power supply voltage; and
 a transconductance operational amplifier connected to receive the voltage across the sensing resistor as a differential input thereto, and comprising
  a first branch, including
   a first transistor of a first majority-carrier conductivity type, and
   a first transistor of a second majority-carrier conductivity type,
   said first transistors being connected in series between said boosted output and a first terminal of said resistor, and
   an intermediate node between said first transistors being connected to a control terminal of the power transistor; and
  a second branch, including
   a second transistor of said first majority-carrier conductivity type, and
   a second transistor of said second majority-carrier conductivity type,
   said second transistors being connected in series between said boosted output and a second terminal of said resistor, with
   said first transistors being connected in a current mirror relationship from said first branch to said second branch, and said second transistors being connected in a current mirror relationship from said second branch to said first branch.

20. The circuit of claim 19, wherein said boosted output has a voltage which is more positive than the first power supply voltage, and the first power supply voltage is more positive than the second power supply voltage.

21. A method for controlling the maximum current in a power field-effect transistor connected to drive a load, comprising the steps of:
 generating a boosted voltage in a charge pump which is connected to receive first and second supply voltages;
 providing a differential signal, which indicates the current passed by said power transistor, to the differential inputs of a differential amplifier which is exclusively supplied by said charge pump, and not directly connected to at least one said supply voltage, said differential amplifier being configured to provide a current output;
 connecting said current output of said differential amplifier to drive a gate terminal of the power transistor.

22. The method of claim 21, wherein said boosted output has a voltage which is not within the range between said first and second power supply voltages.

23. The method of claim 21, wherein said boosted output has a voltage which is more positive than the first power supply voltage, and the first power supply voltage is more positive than the second power supply voltage.

24. The method of claim 21, wherein said amplifier receives said differential input at the emitters of a pair of bipolar transistors which have bases thereof connected together.

25. The method of claim 21, wherein said amplifier receives said differential input at the emitters of a first pair of transistors, which are bipolar and have bases thereof connected together, and wherein said charge pump provides said supply current to a second pair of bipolar transistors which are of opposite type to, and connected in series with, said first pair of transistors.

26. The method of claim 21, wherein said amplifier receives said differential input at the emitters of a first pair of transistors, which are bipolar and have bases thereof connected together and have unequal emitter areas, and wherein said charge pump provides said supply current to a second pair of bipolar transistors which are of opposite type to, and connected in series with, said first pair of transistors.

* * * * *

UNITED STATES PATENT AND TRADEMARK OFFICE
CERTIFICATE OF CORRECTION

PATENT NO. : 5,404,053
DATED : Apr. 4, 1995
INVENTOR(S) : Poma et al.

It is certified that error appears in the above-indentified patent and that said Letters Patent is hereby corrected as shown below:

Title page, item [73] should read--

Assignee: SGS-Thomson Microelectronics S.r.l., Agrate Brianza (Milano), Italy; and Marelli Autronica S.p.A., Milano, Italy Signed and Sealed this Twenty-fourth Day of September, 1996

Attest:

BRUCE LEHMAN

Attesting Officer        Commissioner of Patents and Trademarks

UNITED STATES PATENT AND TRADEMARK OFFICE
CERTIFICATE OF CORRECTION

PATENT NO. : 5,404,053
APPLICATION NO. : 08/075056
DATED : April 4, 1995
INVENTOR(S) : Alberto Poma, Vanni Poletto and Marco Morelli It is certified that error appears in the above-identified patent and that said Letters Patent is hereby corrected as shown below:

Col. 3, line 25, should read:
--power transistor M1 is also used to stabilize the circuit--

Claim 1, col. 5, line 28 should read:
--connected to be powered from said supply terminals--

Signed and Sealed this

Fifth Day of August, 2008

JON W. DUDAS
*Director of the United States Patent and Trademark Office*